United States Patent
Bangsaruntip et al.

(10) Patent No.: US 8,946,680 B2
(45) Date of Patent: Feb. 3, 2015

(54) TFET WITH NANOWIRE SOURCE

(75) Inventors: Sarunya Bangsaruntip, Mount Kisco, NY (US); Isaac Lauer, Mahopac, NY (US); Amlan Majumdar, White Plains, NY (US); Jeffrey Sleight, Ridgefield, NY (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 13/571,657

(22) Filed: Aug. 10, 2012

(65) Prior Publication Data

US 2014/0239258 A1      Aug. 28, 2014

Related U.S. Application Data

(62) Division of application No. 12/777,881, filed on May 11, 2010, now Pat. No. 8,343,815.

(51) Int. Cl.
| | | |
|---|---|---|
| *H01L 29/72* | (2006.01) | |
| *H01L 29/06* | (2006.01) | |
| *B82Y 10/00* | (2011.01) | |
| *H01L 29/08* | (2006.01) | |

(Continued)

(52) U.S. Cl.
CPC ............ *H01L 29/0669* (2013.01); *B82Y 10/00* (2013.01); *H01L 29/0665* (2013.01); *H01L 29/0673* (2013.01); *H01L 29/0847* (2013.01); *H01L 29/42392* (2013.01); *H01L 29/66477* (2013.01); *H01L 29/66977* (2013.01); *H01L 29/775* (2013.01); *H01L 29/78618* (2013.01); *H01L 29/78696* (2013.01); *H01L 29/7391* (2013.01); *H01L 29/0895* (2013.01); *H01L 29/78* (2013.01); *H01L 29/402* (2013.01); *H01L 29/42356* (2013.01); *Y10S 977/723* (2013.01); *Y10S 977/938* (2013.01)

USPC ............... 257/39; 257/24; 257/288; 257/347; 257/401; 977/723; 977/938

(58) Field of Classification Search
USPC .............. 257/24, 39, 288, 347, 401; 977/723, 977/938
See application file for complete search history.

(56) References Cited

U.S. PATENT DOCUMENTS 6,665,658 B1    12/2003    DaCosta et al.
6,928,437 B2    8/2005     Shibuya et al.

(Continued)

FOREIGN PATENT DOCUMENTS

WO     2006081661 A1    8/2006

OTHER PUBLICATIONS

Le Royer et al., Exhaustive Experimental Study of Tunnel Field Effect Transistors (TFETs): From Materials to Architecture, IEEE Xplore, Mar. 17, 2010, pp. 53-56, IEEE.

(Continued)

*Primary Examiner* — Edward Wojciechowicz
(74) *Attorney, Agent, or Firm* — Cantor Colburn LLP; Vazken Alexanian

(57) ABSTRACT

A tunnel field effect transistor (TFET) includes a source region, the source region comprising a first portion of a nanowire; a channel region, the channel region comprising a second portion of the nanowire; a drain region, the drain region comprising a portion of a silicon pad, the silicon pad being located adjacent to the channel region; and a gate configured such that the gate surrounds the channel region and at least a portion of the source region.

9 Claims, 7 Drawing Sheets

(51) Int. Cl.
  *H01L 29/423* (2006.01)
  *H01L 29/66* (2006.01)
  *H01L 29/775* (2006.01)
  *H01L 29/786* (2006.01)
  *H01L 29/739* (2006.01)
  *H01L 29/78* (2006.01)
  *H01L 29/40* (2006.01)

(56) References Cited

U.S. PATENT DOCUMENTS

| | | |
|---|---|---|
| 2002/0038431 A1 | 3/2002 | Chesko et al. |
| 2008/0005264 A1 | 1/2008 | Brunell et al. |
| 2008/0183700 A1 | 7/2008 | Gabriel et al. |
| 2008/0224224 A1 | 9/2008 | Vandenderghe et al. |
| 2009/0057762 A1 | 3/2009 | Bangsaruntip et al. |
| 2010/0174730 A1 | 7/2010 | Leung et al. |
| 2011/0161176 A1 | 6/2011 | Ai |
| 2012/0115296 A1* | 5/2012 | Vandenderghe et al. ..... 438/283 |

OTHER PUBLICATIONS

Knoch, Optimizing Tunnel FET Performance—Impact of Device Structure, Transistor Dimensions and Choice of Material, IEEE Xplore, Mar. 17, 2009, pp. 45-46, IEEE.

Appenzeller et al., Toward Nanowire Electronics, IEEE Transactions on Electron Devices, Nov. 2008, pp. 2827-2845, vol. 55, No. 11, IEEE.

Verhulst et al., Tunnel field-effect transistor without gate-drain overlap, Applied Physics Letters 91, 2007, pp. 053102-1-053102-3, vol. 91, American Institute of Physics.

* cited by examiner

100

```
┌─────────────────────────────────────────────────────────────┐
│ FORM NANOWIRE AND PADS IN SILICON LAYER OF SOI SUBSTRATE;   │
│ FORM RECESS UNDER NANOWIRE AND PADS IN BOX LAYER OF SOI SUBSTRATE │
│                          101                                │
└─────────────────────────────────────────────────────────────┘
                              ⇩
┌─────────────────────────────────────────────────────────────┐
│   FORM GATE COMPRISING DIELECTRIC AND POLYSILICON AROUND NANOWIRE │
│                          102                                │
└─────────────────────────────────────────────────────────────┘
                              ⇩
┌─────────────────────────────────────────────────────────────┐
│                 FORM SPACER ADJACENT TO GATE                │
│                          103                                │
└─────────────────────────────────────────────────────────────┘
                              ⇩
┌─────────────────────────────────────────────────────────────┐
│                    IMPLANT DRAIN REGION                     │
│                          104                                │
└─────────────────────────────────────────────────────────────┘
                              ⇩
┌─────────────────────────────────────────────────────────────┐
│                IMPLANT NANOWIRE SOURCE; ANNEAL              │
│                          105                                │
└─────────────────────────────────────────────────────────────┘
```

TFET WITH NANOWIRE SOURCE

CROSS REFERENCE TO RELATED APPLICATION

This application is a divisional of U.S. application Ser. No. 12/777,881, filed on May 11, 2010 now U.S. Pat. No. 8,343,815 the disclosure of which are incorporated herein by reference in their entirety.

FEDERAL RESEARCH STATEMENT

This invention was made with Government support under Government Contract FA8650-08-C-7806, awarded by the Defense Advanced Research Projects Agency (DARPA). The Government has certain rights in this invention.

FIELD

This disclosure relates generally to the field of tunnel field effect transistors.

DESCRIPTION OF RELATED ART

Tunnel field effect transistors (TFETs) may be used as a replacement for or complement to metal-oxide-semiconductor FETs (MOSFETs). A TFET may comprise a nanowire channel, which may provide good electrostatic control of the channel due to gate-all-around (GAA) geometry. However, relatively high fields at the drain end of a nanowire channel TFET may lead to parasitic ambipolar behavior that increases the TFET off current, resulting in a relatively inefficient device.

SUMMARY

In one aspect, a tunnel field effect transistor (TFET) includes a source region, the source region comprising a first portion of a nanowire; a channel region, the channel region comprising a second portion of the nanowire; a drain region, the drain region comprising a portion of a silicon pad, the silicon pad being located adjacent to the channel region; and a gate configured such that the gate surrounds the channel region and at least a portion of the source region.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 1 illustrates an embodiment of a method of forming a TFET with a nanowire source.

FIG. 2 illustrates an embodiment of a silicon-on-insulator (SOI) wafer.

DETAILED DESCRIPTION

Embodiments of systems and methods for a TFET with a nanowire source are provided, with exemplary embodiments being discussed below in detail. The TFET source injection point may be located in a GAA nanowire, and the drain may be located in a planar single-gated region. This configuration suppresses ambipolar behavior in the TFET, thereby reducing the TFET off current.

Figure 2:
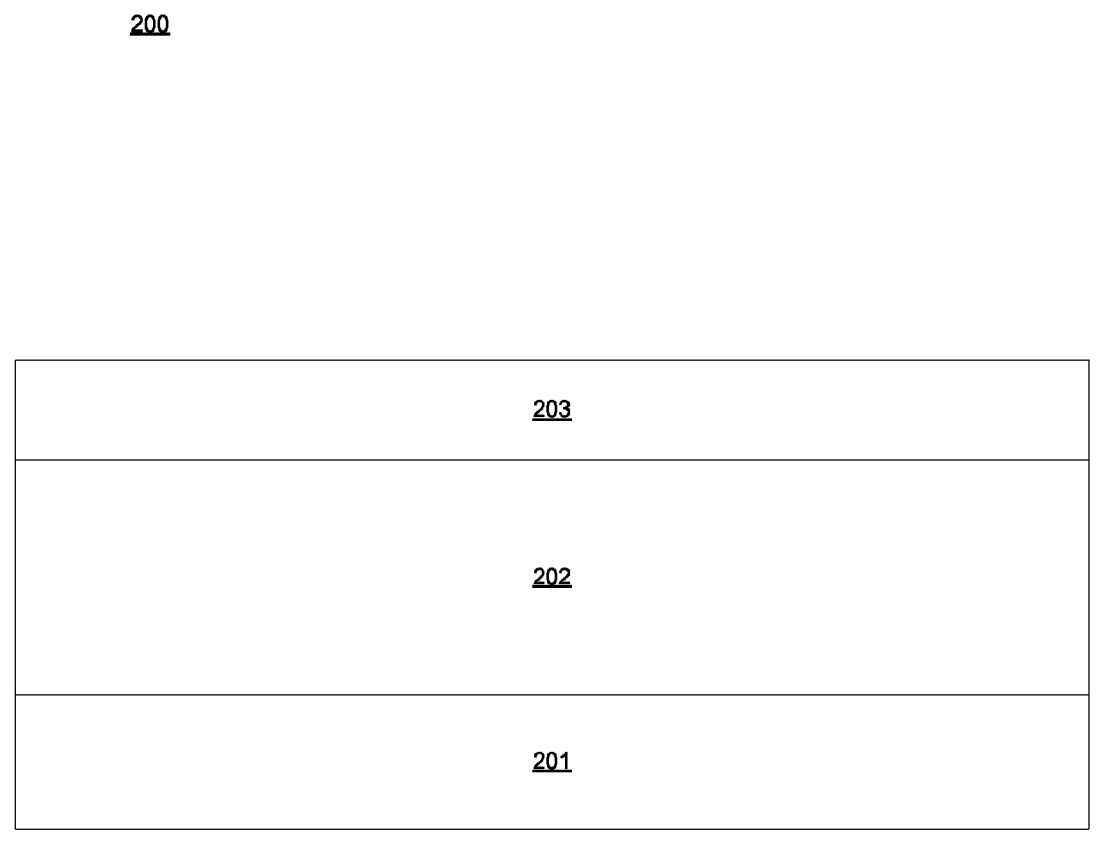
Figure 3:
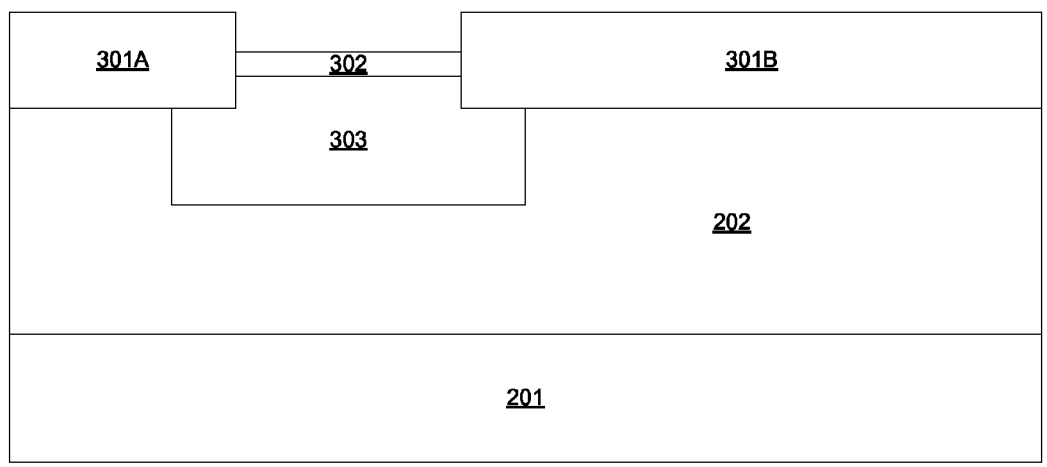
FIG. 3 illustrates an embodiment of the SOI wafer of FIG. 2 after formation of a nanowire.

FIG. 1 illustrates an embodiment of a method of forming a TFET with a nanowire source. FIG. 1 is discussed with reference to FIGS. 2-7. In block 101, a SOI wafer 200 as shown in FIG. 2 is used to form a structure 300 comprising a silicon nanowire 302 as shown in FIG. 3. SOI wafer 200 comprises silicon substrate 201 under buried oxide (BOX) 202 under silicon layer 203. To form nanowire 302, the locations of nanowire 302 and silicon pads 301A-B are lithographically defined and etched in silicon layer 203. After nanowire 302 and silicon pads 301A-B are etched, a portion of BOX 202 is removed to form recess 303 under nanowire 302 and silicon pads 301A-B. Recess 303 may be formed using a hydrofluoric (HF) acid dip in some embodiments. Nanowire 302 is located between silicon pads 301A-B, may have a length between about 50 nanometers (nm) and about 200 nm in some embodiments, and may have a diameter between about 3 nm and about 50 nm in some embodiments.

Figure 4:
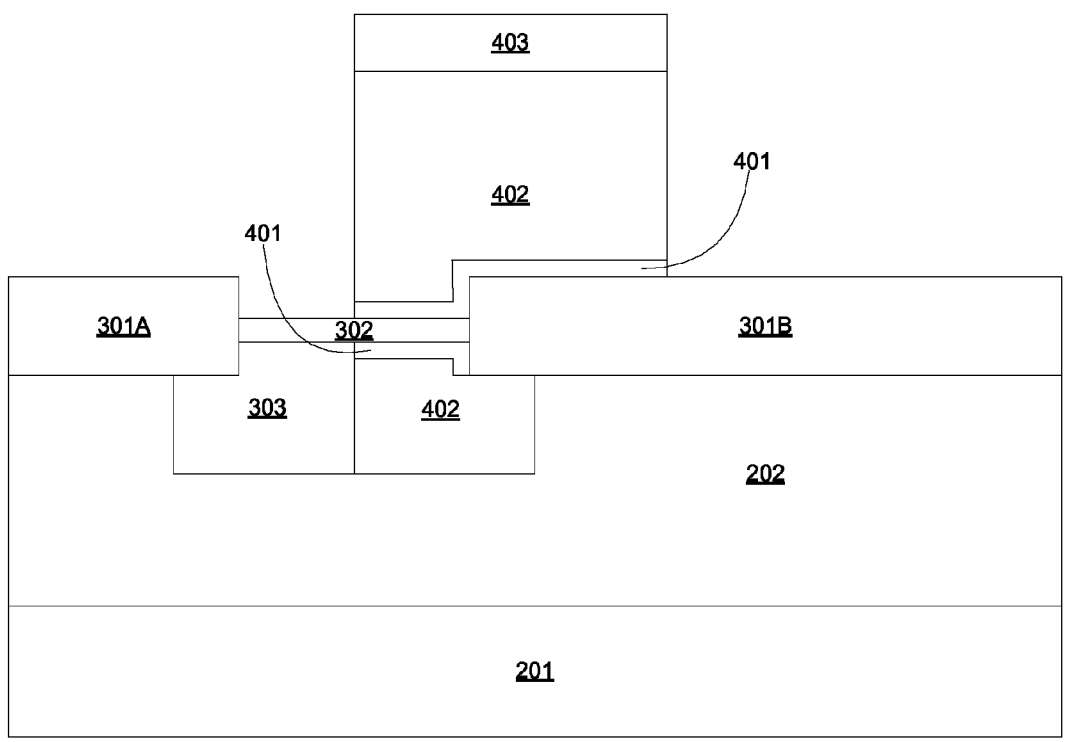
FIG. 4 illustrates an embodiment of the structure of FIG. 3 after formation of a gate.

In block 102, a gate comprising dielectric layer 401 and gate polysilicon 402 is formed around nanowire 302 and in recess 303, as shown in FIG. 4. The gate has a GAA configuration. Dielectric layer 401 completely surrounds nanowire 302. Dielectric layer 401 may comprise thermally grown oxide or a high-k material in some embodiments. The gate may optionally comprise a metal layer (not shown) located between dielectric layer 401 and gate polysilicon 402. A hardmask layer 403, which may comprise silicon nitride, is then formed over the gate polysilicon 402.

Figure 5:
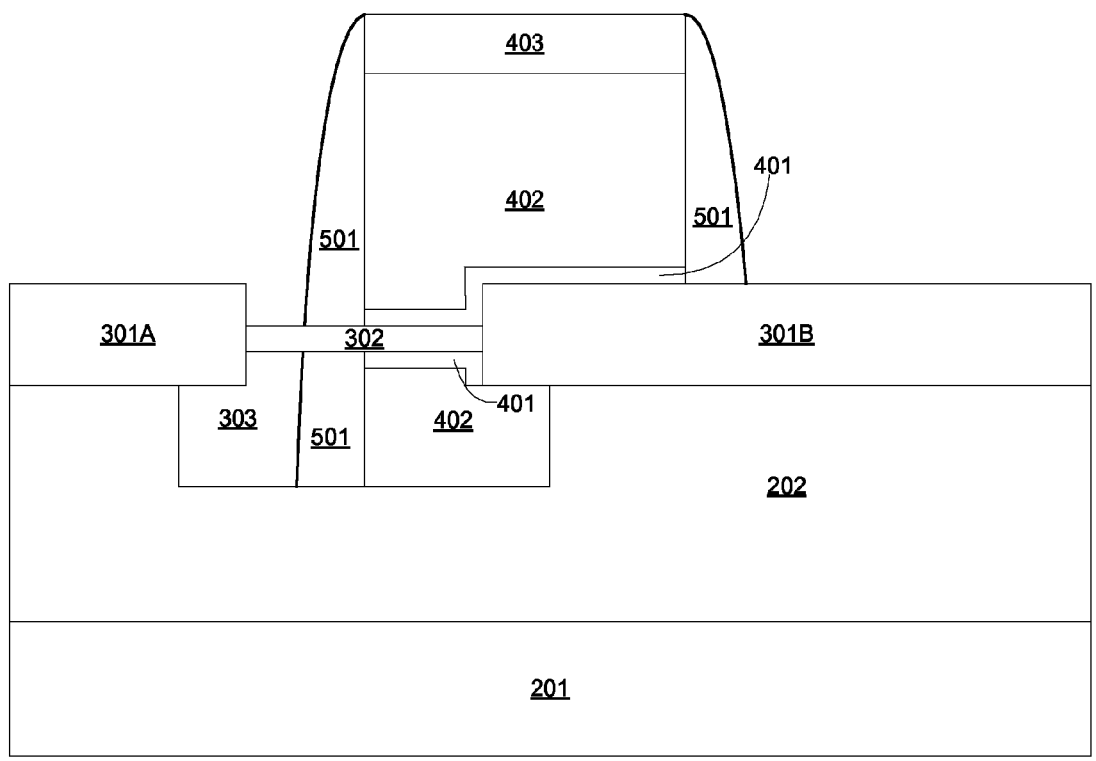
FIG. 5 illustrates an embodiment of the structure of FIG. 4 after formation of a spacer.

In block 103, a spacer 501 is formed adjacent to the gate comprising dielectric layer 401 and gate polysilicon 402, as shown in FIG. 5. Spacer 501 may comprise a nitride in some embodiments.

Figure 6:
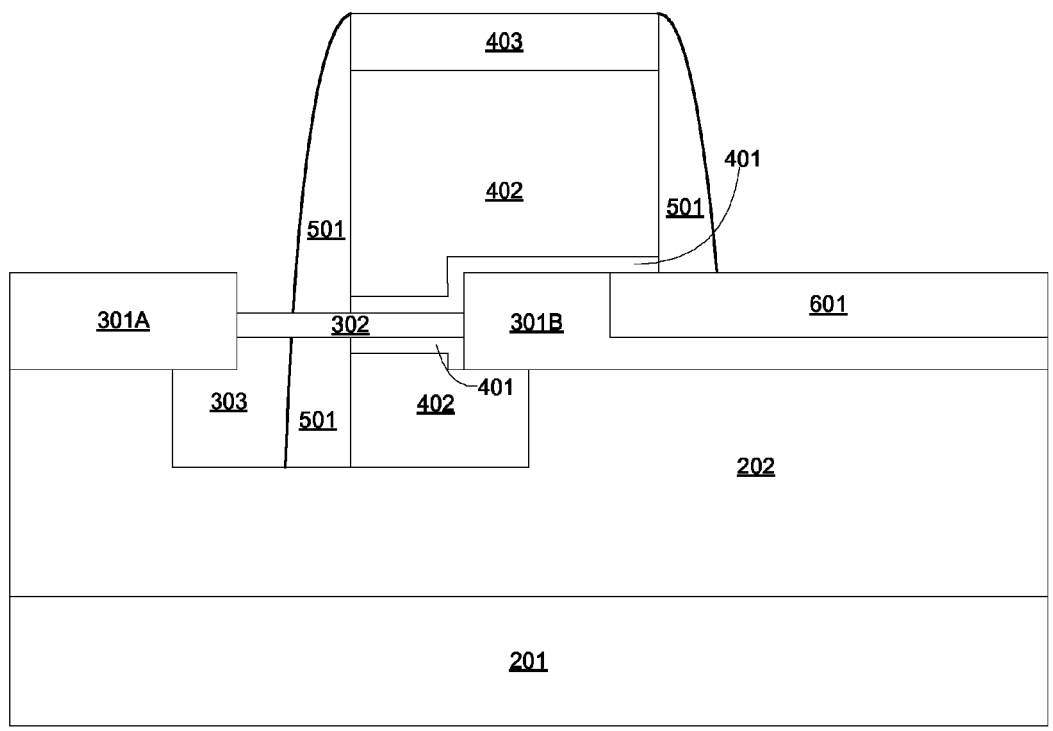
FIG. 6 illustrates an embodiment of the structure of FIG. 5 after formation of the drain region.
Figure 7:
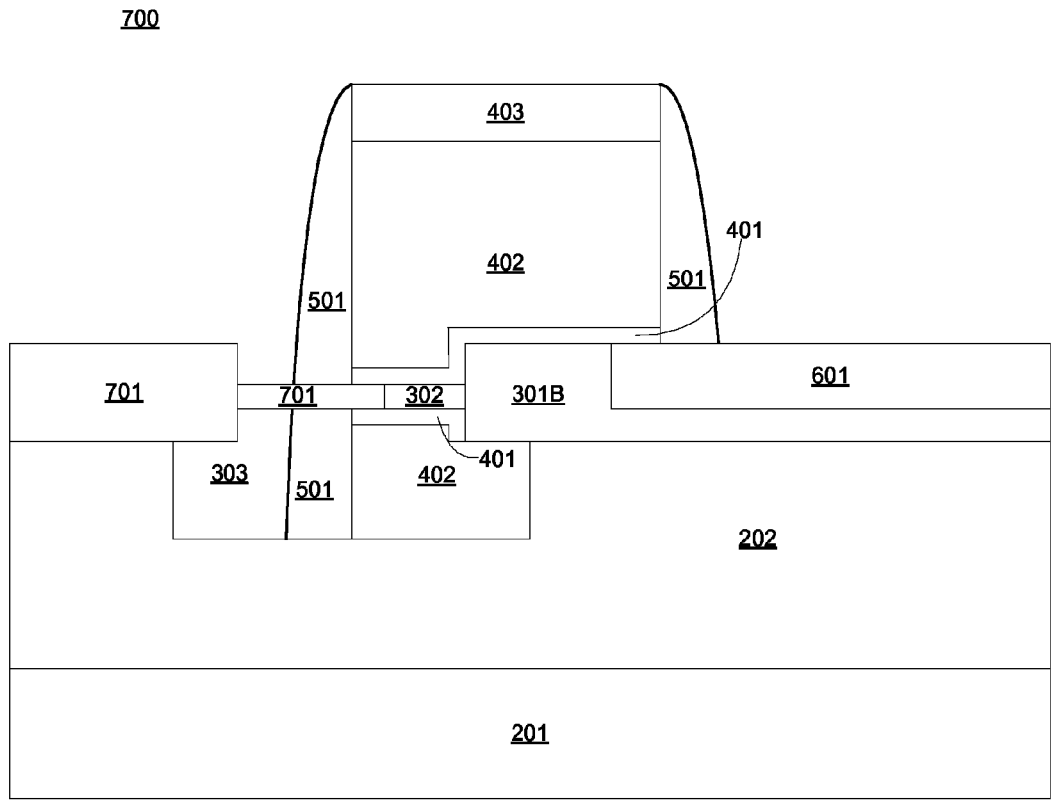
FIG. 7 illustrates an embodiment of a TFET with a nanowire source.

In block 104, a drain region 601 is formed in silicon pad 301B by implantation of dopants, as shown in FIG. 6. Drain region 601 may be implanted with n-type dopants including but not limited to arsenic (As) or phosphorous (P). Implantation of drain region 601 may be followed by an anneal in some embodiments. Drain region 601 is located in a planar single-gated region In block 105, silicon pad 301A and a portion of nanowire 302 are implanted with dopants to form nanowire source 701 as shown in FIG. 7. Nanowire source 701 may be implanted with p-type dopants including but not limited to boron (B) or boron diflouride ($BF_2$). Implantation of nanowire source 701 is followed by an anneal. The resulting device comprises a TFET 700 with a nanowire source 701. A portion of nanowire source 701 comprises a GAA configuration (i.e., a portion of nanowire source 701 is located inside the gate of TFET 700). The undoped portion of nanowire 302 comprises the channel of TFET 700; the channel also comprises a GAA configuration. TFET 700 may exhibit good electrostatic control of the nanowire channel 302 while having reduced ambipolar behavior due to the GAA portion of nanowire source 701. In some embodiments, hardmask layer 403 may be removed after formation of nanowire source 701, and a top portion of gate polysilicon 402 may be silicided to form a gate contact (not shown).

The technical effects and benefits of exemplary embodiments include formation of a TFET with reduced off current.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A tunnel field effect transistor (TFET), comprising:
   a source region, the source region comprising a first portion of a nanowire;
   a channel region, the channel region comprising a second portion of the nanowire;
   a drain region, the drain region comprising a first portion of a silicon pad, the silicon pad being located adjacent to the channel region; and
   a gate configured such that the gate surrounds the channel region and at least a second portion of the silicon pad and such that the gate covers a surface of a third portion of the silicon pad and at least a portion of a surface of the drain region.

2. The TFET of claim 1, wherein the nanowire comprises silicon, and the source region further comprises a silicon pad located adjacent to the first portion of the nanowire.

3. The TFET of claim 1, wherein the source region is doped with p-type dopants, and the drain region is doped with n-type dopants.

4. The TFET of claim 1, wherein the gate comprises a dielectric layer and a gate polysilicon region, wherein the dielectric layer is located adjacent to and surrounding the nanowire, and the gate polysilicon region is located over the dielectric layer.

5. The TFET of claim 4, wherein the dielectric layer is formed adjacent to and surrounding the first portion of the nanowire and the second portion of the silicon pad, the gate polysilicon region is formed over the dielectric layer.

6. The TFET of claim 5, wherein the drain region is located in the first portion of the silicon pad and is at least partially not located underneath the gate.

7. The TFET of claim 4, wherein the gate further comprises a metal layer located between the dielectric layer and the gate polysilicon region.

8. The TFET of claim 4, wherein the dielectric layer comprises one of thermally grown oxide and a high-k material.

9. The TFET of claim 1, further comprising a spacer comprising a nitride located adjacent to the gate.

* * * * *